United States Patent [19]
Remsburg

[11] Patent Number: 5,864,466
[45] Date of Patent: Jan. 26, 1999

[54] THERMOSYPHON-POWERED JET-IMPINGEMENT COOLING DEVICE

[76] Inventor: Ralph Remsburg, 2662 Beacon Hill Dr. #308, Auburn Hills, Mich. 48326

[21] Appl. No.: 758,025

[22] Filed: Nov. 27, 1996

Related U.S. Application Data

[63] Continuation of Ser. No. 277,232, Jul. 19, 1994, abandoned.
[51] Int. Cl.$^6$ ........................................... H05K 7/20
[52] U.S. Cl. ..................... 361/700; 165/80.4; 174/15.2; 361/699
[58] Field of Search ................... 165/802, 804, 165/185; 174/16.3, 15.2; 257/714; 361/689, 698, 699, 700, 704

[56] References Cited

U.S. PATENT DOCUMENTS

| | | | |
|---|---|---|---|
| 3,851,221 | 11/1974 | Beaulieu et al. | 361/700 |
| 3,986,550 | 10/1976 | Mitsuoka | 165/105 |
| 4,233,644 | 11/1980 | Hwang et al. | 361/384 |
| 4,238,759 | 12/1980 | Hunsperger | 357/28 |
| 4,277,816 | 7/1981 | Dunn et al. | 361/384 |
| 4,494,171 | 1/1985 | Bland et al. | 361/386 |
| 4,620,215 | 10/1986 | Lee | 357/81 |
| 4,653,579 | 3/1987 | Fujii et al. | 165/104.33 |
| 4,682,651 | 7/1987 | Gabuzda | 165/80.3 |
| 4,685,081 | 8/1987 | Richman | 365/1 |
| 4,750,086 | 6/1988 | Mittal | 361/382 |
| 4,812,733 | 3/1989 | Tobey | 323/285 |
| 4,901,201 | 2/1990 | Crowe | 361/384 |
| 4,949,164 | 8/1990 | Ohashi et al. | 361/700 |
| 5,063,476 | 11/1991 | Hamadah et al. | 361/384 |
| 5,390,077 | 2/1995 | Paterson | 165/80.3 |

OTHER PUBLICATIONS

U.S. Patent Application, 07/674,820, A Cooling Module for High Density Multi–Chip Array, Mar. 22, 1191, Remsburg.

*Primary Examiner*—Gregory D. Thompson
*Attorney, Agent, or Firm*—Klima & Pezzlo, P.C.

[57] ABSTRACT

A thermosyphon-powered jet-impingement cooling device delivering superior thermal energy dissipation for compact heat sources such as electronic devices. Thermal energy from a heat source travels through the heat source/heat spreader plate interface to the heat spreader plate and heat spreader plate extended surface. Thermal energy is transferred by convection to a single or two-phase coolant media. The heated and/or boiling, less dense coolant begins to expand and rise. The rising coolant or vapor approaches a cold plate and velocity slows due to the greater cross-sectional flow area. The coolant heat energy is released by convection or condensation to the heat dissipation/fluid interface surface, and is then conducted through the cold plate, across the cold plate/heat dissipating device thermal interface, and then to the heat dissipating device. As the cooled media contracts and/or condenses to form droplets, the coolant or droplets begin to fall. As heated or boiling coolant continues to rise, the falling coolant or droplets are both pushed from the high pressure (heated) annulus and pulled from the low pressure (cooled) center through an impingement jet orifice. The coolant impinges against a concave heat/fluid interface surface. The impinging jet of coolant media of the present invention greatly reduces the thermal boundary layer at the point of impingement.

11 Claims, 8 Drawing Sheets

THERMOSYPHON-POWERED JET-IMPINGEMENT COOLING DEVICE

This application is a Continuation of application Ser. No. 08/277,232, filed on Jul. 19, 1994, now abandoned.

BACKGROUND

1. Field of Invention

The present invention relates to a device for cooling by natural convection, with or without phase change. Specifically to such devices incorporating unique surface contours that provide a thermosyphon effect with jet-impingement cooling of the heat source.

2. Description of Prior Art

In many fields, the control and dissipation of excess thermal energy is desired. The speed and reliability of modern electronic equipment depend on the cost-efficient dissipation and control of waste heat. As component performance increases and size decreases, the heat flux (power/area) spirals upward.

Air has been used as a coolant since the origin of electronic devices. Gravity-dependant, natural air convection produces a heat transfer coefficient of about 5 to 30 W/m$^2$ ° C. Using only natural convection with air, a typical 1 Watt, 45 millimeters per side, horizontally-mounted device, has a temperature rise ($\Delta T$) of roughly 45° C. Forced air convection (3 meters per second velocity) can reduce the device's $\Delta T$ to roughly 15° C. As electronic components have required better heat dissipation techniques, designers have increased the power of air cooling systems. High velocity air systems reach a point of diminishing returns. Higher power cooling systems also generate their own high waste heat loads and high noise levels from air moving devices. These high heat loads and high noise levels must then also be controlled. The cost constraints in this approach are nowhere more apparent than in the field of personal computers. These systems use high performance VLSI (Very Large Scale Integration), CMOS (Complementary Metal-Oxide Semiconductor), and RISC (Reduced Instruction Set Computer) technologies. Some high heat flux electronic devices present a thermal obstacle that forced convection with air cannot overcome. Therefore, there is a great need to reduce an electrical device's temperature in the most efficient manner possible. CMOS devices especially, show great increases in performance and reliability when operated at reduced temperatures. Tobey teaches the use of reduced temperatures to gain increased reliability and speed in CMOS devices in U.S. Pat. 4,812,733 (1989).

Various methods enhance the heat transfer capabilities of forced air convection systems. Such methods are well known in the art and include enhanced surfaces, swirl flow, jet-impingement, vibration, injection or suction, and electrostatic or magnetic fields. These techniques are beneficial, but are limited by the physical properties of the ambient air, and can require significant mechanical apparatus.

Forced air convection heat transfer coefficients range from approximately 30 to 300 W/m$^2$ °C. An arrangement for air-impingement cooling of electronic modules is disclosed by Dunn et al. in U.S. Pat. No. 4,277,816 (1981). Dunn utilizes air, directed under pressure to the electronic modules. This device lacks a leak-proof air exhaust passage, therefore, the cross-flow degradation of the cooler inlet air with heated exhaust air causes a great loss of efficiency. Modules at the system air exhaust are exposed to exhaust air that has been heated by the previous modules. Hwang et al., in U.S. Pat. No. 4,233,644 (1980) teaches the use of a pair of air-moving devices to pull air through a plenum chamber. The air is then directed to impinge against the electronic modules. In Hwang's device, the air is directed to separate inlet and exhaust passages. In most instances, the use of this device requires a major level of redesign of the entire electronic cabinet, or the intention to use such a cooling scheme while designing the equipment. Hamadah et al., in U.S. Pat. No. 5,063,476, discloses an apparatus for controlled air-impingement cooling. This device utilizes controlled inlet and exhaust air channels contained in circuit board-sized modules. Hamadah's apparatus is thought to provide a lower level of redesign for an overheating electronic cabinet, but still suffers from the physical properties of air and the limitations of air-moving devices. U.S. Pat. No. 4,682,651, by Gabuzda (1987), describes a heat sink array for use with air-impingement systems. The novelty of this device is that the heat sink is segmented to minimize the effect of thermal contraction and expansion on the circuit packages. Thermal mismatch is a concern between the circuit board and the leaded side of a circuit package, as this mismatch stresses the solder joints. Gabuzda's device is only beneficial when the circuit package is so large, and the heat transfer so inefficient, that controlling the thermal mismatch on the non-leaded side of a component will have some effect on reliability.

Peltier junctions are often suitable for cooling discrete electronic devices below ambient temperature. The use of Peltier junctions in this manner is taught in U.S. Pat. No. 4,238,759 by Hunsperger, 4,685,081 by Richman (1987), and 4,812,733 by Tobey (1989). The obstacle to incorporating a Peltier junction into a design is the resultant condensate and the inefficiency of these device. By example to cool a 10-Watt device, an additional 25 Watts of heat may be developed by the Peltier junction itself, then requiring removal of 35 Watts of heat. Some computer designers have used a Peltier junction to cool the central processing unit (CPU). and then additional air-moving fans to cool the Peltier junction.

In 1935 experimenters reported using de-ionized water to cool components. Natural convection in water can produce heat transfer coefficients in the range from 300 to 2,000 W/M$^2$ °C. For the previously mentioned one Watt electronic device, the $\Delta T$ is only 1°C. when immersed in water. Special synthetic dielectric coolants have recently been developed for electronic cooling. Some of these are silicate ester, perfluorocarbon, and polyalphaolephin based compounds.

Many systems, such as the Cray-2 Supercomputer, have been designed to operate immersed in a perfluorocarbon fluid using natural convection. This technique is complicated by the properties of the fluid high volatility and low surface tension. These problems have been addressed in the industry by securing the perfluorocarbon fluid in flexible plastic bags. These bags are attached to the electronic circuit boards. This approach decreases the effectiveness of free convection by restricting the internal fluid motion, and also adds unwanted thermal impedance as the heat must pass through the thermally insulative plastic bag containing the fluid.

Forced liquid convection heat transfer coefficients are much higher than forced air (30 to 300 W/m$^2$ °C.), and range from approximately 300 to 6,000 W/m$^2$ °C. The prior art for liquid jet-impingement devices does not have the limitations of the properties of air, but still suffer from the drawbacks associated with liquid moving devices. In my own U.S. patent application, Ser. No. 674,820 of 1991, a flexible module is described that allows the controlled application of multiple jets of an impinging liquid coolant. This device is unique because novel features are used to seal the liquid from the electronic components while still delivering a degree of geometric flexibility, and the maximum amount of heat transfer. Bland et al., in U.S. Pat. No. 4,494,171 (1985), and Crowe, in U.S. Pat. No. 4,901,201 both describe very complex forced impingement cooling apparatus referred to by the acronym CHIC, for Compact High Intensity Cooler. Crowe's device offers a means to provide dedicated cooling for high heat flux devices located in the midst of other components requiring minimal cooling. Users of Crowe's invention must know the exact location of each of the high heat flux devices in order to use the CHIC in only that location, because a lower cooling level is provided to all other components. U.S. Pat. No. 4,750,086, by Mittal (1988), teaches the use of a forced liquid jet-impingement device that incorporates a bellow seal and a thick heat spreader. In all of the aforementioned jet-impingement devices, liquid and air, a pressurized media is used for forced-convection heat transfer. Forced convection requires an external power source to propel the coolant, in addition to the coolant moving device itself. These devices create waste heat and must be located to distribute the cooling media in an evenly distributed manner. This entails the use of plumbed lines and leak-proof modules. No device known, has used the ability of a natural convection thermosyphon to power the jet-impingement apparatus.

Although liquid cooling systems are much more efficient than air, they have been cost prohibitive in small systems such as personal computers, because of the necessary fluid-moving device, plumbed lines, and leak-proofing.

Cooling a heat source by means of phase change (boiling and condensing) is the most efficient method used in the industry. While single-phase forced liquid convection heat transfer coefficients range from 300 to 6,000 W/m$^2$ °C., boiling water heat transfer coefficients range from approximately 3,000 to 60,000 W/m$^2$ °C. and condensing steam systems operate in the range of 6,000 to 120,000 W/m$^2$ °C. Mitsuoka, in U.S. Pat. No. 3,986,550 (1976) describes a cooling device operating on the phase change principle that maintains separation between the liquid and gas phases of the coolant media. No attempt is made in Mitsuoka's device to increase the heat transfer coefficient by use of internal extended surfaces, jet-impingement techniques, or other geometric forms. In fact, in the described patent, Mitsuoka teaches away from impingement by using a variety of devices placed in the flowstream to prevent intermixing of the fluid and vapor phases of the coolant.

Within the prior art of natural convection, air-cooled heat sinks, it is not evident that a specific geometric form will channel the natural connection flowfield currents to gain greater heat dissipation through minimized thermal boundary layers, or that this geometric form (with adjustment for coolant properties) can be used in conjunction with natural convection liquid-immersed heat sinks. Although there are many examples of prior art single-phase thermosyphon devices, and prior art two-phase thermosyphon-powered cooling devices, it is clearly unobvious to those skilled in the art that there are advantages in heat transfer coefficient and (operating efficiency when the jet-impingement technique is combined with either or both of these two approaches, ie, single-phase thermosyphon powered jet-impingement, or two-phase thermosyphon-powered jet impingement. Further, in some thermosyphon-powered prior art (Mitsuoka), the return of the condensate to the boiling pool is shown as occurring in the geometric center of the heat source. The prior art does not recognize that specific novel geometric features that connect fluid transfer channels affect the heat transfer coefficient, and that significant departure from these unobvious geometric ratios will result in a device that may operate in a reverse mode, resulting in a severe degradation in performance. A review of the literature yields no discussion of these combinations, or the supposition that such combinations are advantageous or even possible.

Objects and Advantages

The present invention transfers heat by use of a self-contained, jet-impingement, thermosyphon effect and does not require large volumes of moving coolant, plumbed lines, or extensive module redesign when incorporated. The thermal mass of the liquid-filled current invention retards the dramatic temperature shock caused by applying power to a device, and greatly enhances solder joint reliability.

The present invention transfers heat by use of a jet-impingement, thermosyphon effect and does not generate or use additional energy.

The present invention, in a single-phase configuration, can use any gas or liquid cooling media that expands when heated. In either a single-phase or two-phase configuration, it offers significantly higher heat transfer coefficients than simple device immersion in an identical cooling media under similar cooling parameters.

The present invention can use a perfluorocarbon fluid. Because the liquid is sealed within the cooling device, leakage is eliminated. Thermal impedance is low because the internal heat transfer surfaces are metallic or another material offering high thermal conductivity.

The present invention provides an efficient and inexpensive liquid cooling system, primarily for the thermal management of small electronic components, but is applicable to any heat generating device.

Therefore, in accordance with an aspect of the present invention, several primary objects and advantages of the present invention are:

(a) to provide a new and improved method and apparatus of natural convection heat transfer that is contained in one small module;

(b) to provide an improved natural convection heat transfer device with certain novel geometric features that provide surprising and highly advantageous results, primarily in the form of greater thermal energy transfer coefficients;

(c) to provide a method and apparatus for natural convection heat transfer with the cooling media applied as an internal impingement flow configuration that provides the lowest thermal resistance available in a low-cost, passive configuration;

(d) to provide a method and apparatus for leak-proof natural convection cooling that controls the large thermal volume expansion rate of the coolant;

(e) to provide a method and apparatus for natural convection cooling that provides the thermal benefits of forced convection without the need for an active coolant media moving device;

(f) to provide an improved apparatus with all of the previously described benefits for natural convection cooling device applied to a two-phase coolant device.

(g) to provide a method and apparatus for phase change with jet impingement of the coolant media cooling that provides greater thermal benefits than phase change devices that do not incorporate specialized coolant passages;

(h) to provide an integral method with cooling that minimizes the thermal shock experienced by electronic devices when operated at high clock rates under transient conditions.

These and other objects and advantages of the present invention will no doubt become obvious to those of ordinary skill in the art after having read the following detailed description of the preferred embodiment, which is illustrated in the various drawing figures.

DRAWING FIGURES

In the drawings, closely related figures have the same number but different alphabetic suffixes.

| Reference Numerals in Drawings | |
|---|---|
| 10 heat source | |
| 11 thermosyphon-powered jet-impingement cooling device | |
| 12 heat spreader plate | 13 geometric body form |
| 14 cold plate | 16 heat dissipating device |
| 18 heat/fluid interface surface | |
| 20 heat dissipation/fluid interface surface | |
| 22 outer surface | 24 inner channel wall |
| 26 channel wall body | |
| 28 heat spreader extended surface | |
| 30 fluid coolant | 32 heated fluid |
| 34 expanding fluid | 36 rising fluid |
| 38 cooled fluid | 40 falling fluid |
| 42 point of impingement | 46 fluid expansion surface |
| 48 fluid contraction surface | 52 impingement jet channel |
| 54 angle | 56 highest edge of angle |
| 58 heat source/heat spreader plate thermal interface | |
| 60 cold plate/heat dissipating device thermal interface | |
| 62 pin-finned extended surface | 64 pin-fins |
| 66 pin-fin inner circle | 68 pin-fin outer circle |
| 70 thermal boundary layer | 72 boiling liquid phase |
| 74 dendritic heat/fluid interface surface | 76 vaporized coolant |
| 78 coolant condensate droplets | 80 condenser surface |
| 82 spring clip | 84 condenser mass |
| 86 printed circuit board | 88 electrical pins |
| 90 two-phase fluid coolant | 92 falling coolant droplet |
| 94 impingement-jet supply pool | |

Description—FIGS. 1 to 8

Figure 1:
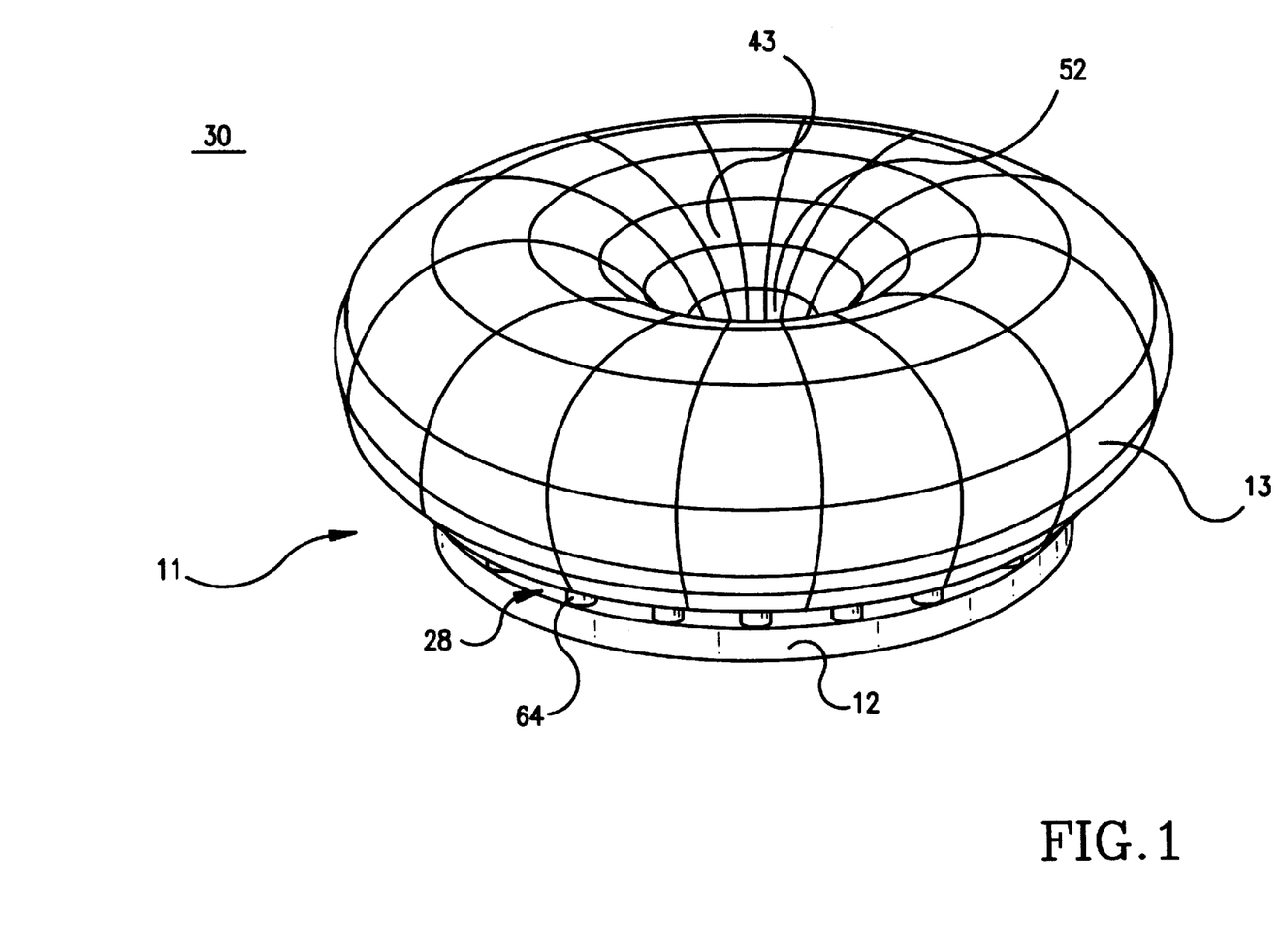
FIG. 1 shows the present invention as a basic geometric form in an isometric view.

FIG. 1 illustrates an external isometric view of a thermosyphon-powered jet-impingement cooling device 11 of the present invention in the most basic form. The thermosyphon-powered jet-impingement cooling device 11 is enveloped by a fluid coolant 30. In this embodiment, the fluid coolant is ambient air. A geometric body form 13 is mounted above a heat spreader plate 12 and is constructed of a thermally insulative material such as polyurethane. A heat spreader extended surface 28 of heat spreader plate 12 allows greater surface area and heat dissipation than a flat plate. A fluid contraction surface 48 leads fluid coolant 30 into an impingement jet channel 52.

Figure 2:
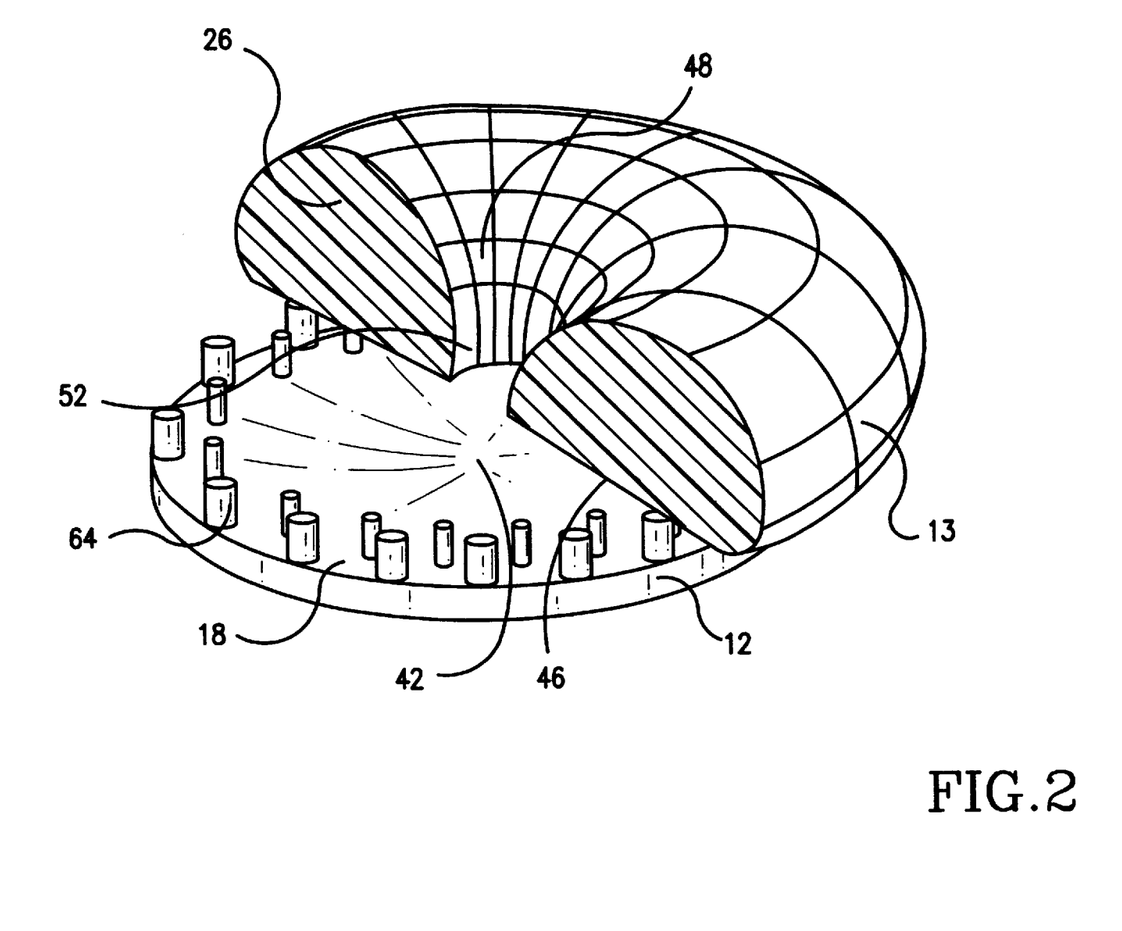
FIG. 2 depicts the present invention in a cut-away, isometric view.

FIG. 2 shows an isometric cut-away view of the geometric form of the present invention. A plurality of pin-fins 64 are mounted to heat spreader plate 12 on a heat/fluid interface surface 18. A point of impingement 42 on heat spreader plate 12 is at the lowest point of the concave surface of heat/fluid interface surface 18. Geometric body form 13 is formed by a channel wall body 26 having no large internal material voids. The underside of geometric form 13 is an angled fluid expansion surface 46 that contacts and is supported by the uppermost surface of pin-fins 64 which are constructed of a highly thermally conductive material such as copper or aluminum. The inward surface of channel wall body 26 forms fluid contraction surface 48 that forms impingement jet channel 52.

Figure 3:
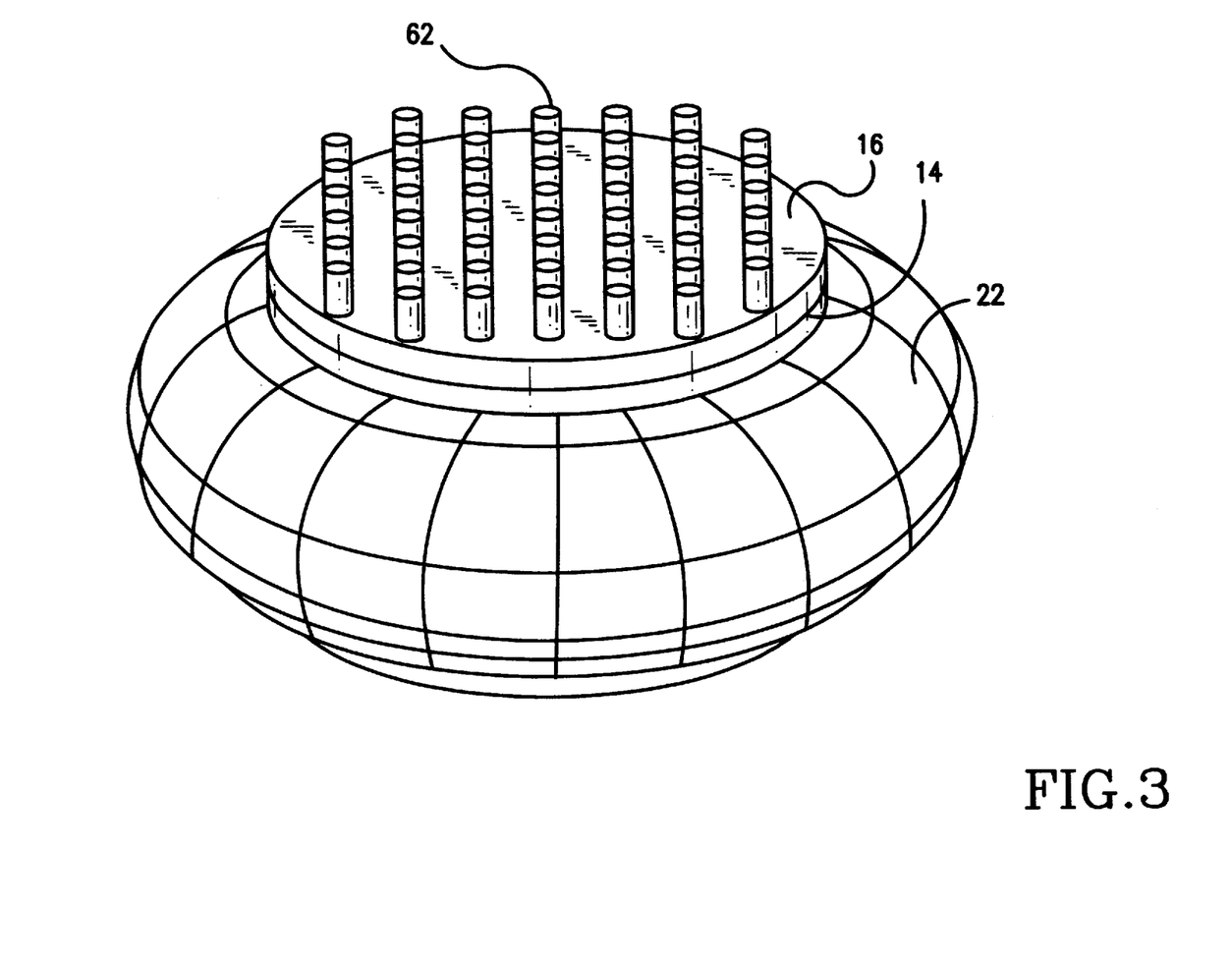
FIG. 3 illustrates the present invention in a liquid impinging-jet embodiment in an external isometric view.

FIG. 3 shows an external isometric view of the preferred embodiment of the present invention. A curved outer wall 22 forms the outer envelope of the active portion of the device. Outer wall 22 is primarily spherical in shape, non-porous, and a good thermal insulator such as a non-filled polymer. A cold plate 14 allows heat transfer from the internal fluid to the exterior of the apparatus. A heat dissipating device 16 is shown as having a pin-finned extended surface 62. Heat dissipating device 16 and pin-finned extended surface 62 are constructed of a highly thermally conductive material such as copper or aluminum.

Figure 4:
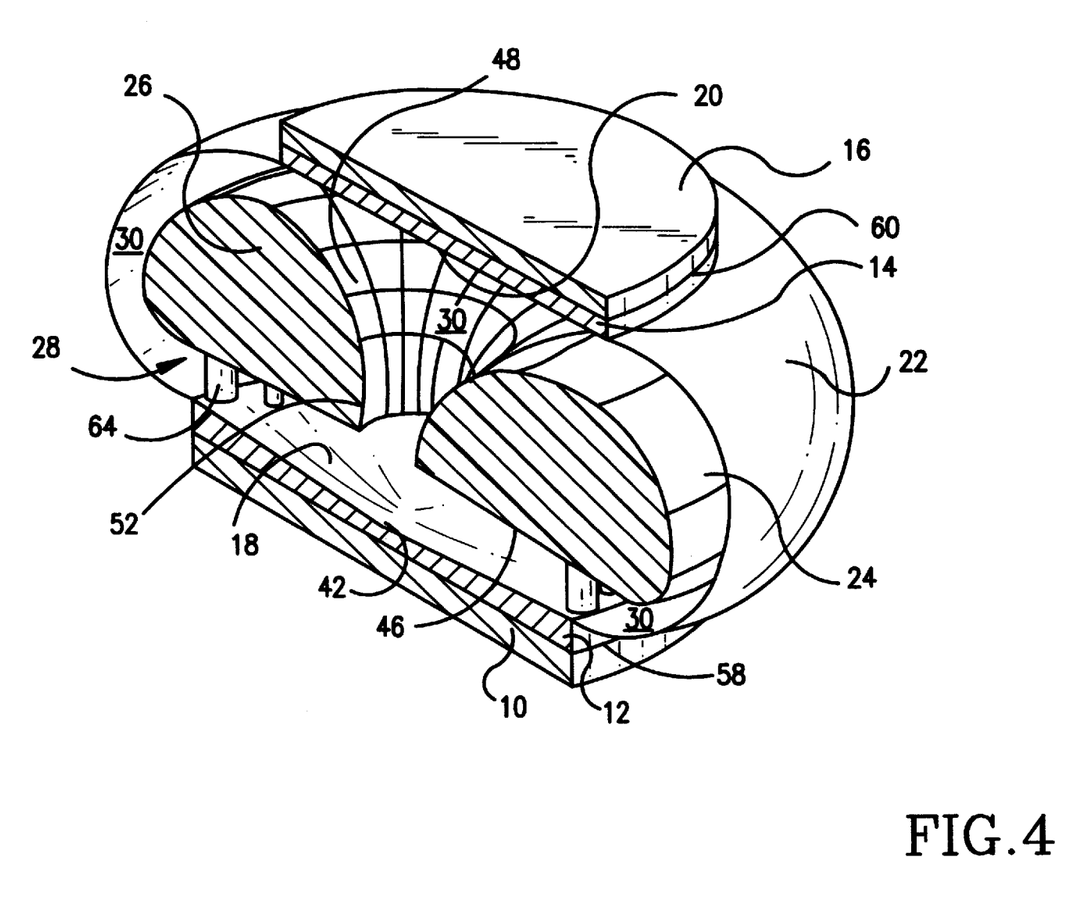
FIG. 4 depicts the preferred embodiment of the present invention in a cut-away, isometric view.

A cut-away view of the internal components of the thermosyphon-powered jet-impingement feature of the present invention is shown in FIG. 4. A heat source 10 can be any heat generating device. Examples of heat sources are electronic devices, motors, engines, light sources, nuclear devices, etc. In the preferred embodiment of the present invention, heat source 10 is characterized as a square microprocessor computer chip. Heat spreader plate 12 is constructed in the shape of a square from material having a high value of thermal conductivity. Heat spreader plate 12 becomes circular as it extends away from square heat source 10 and toward circular heat/fluid interface surface 18. Heat spreader plate 12 is in intimate thermal contact with heat source 10 evenly conducting the distributed heat to heat/fluid interface surface 18. If heat spreader plate 12 is not made as a square to circular shaped transition form, heat spreader plate 12 should be circular through-out with a diameter as large as the diagonal distance across square heat source 10. Heat transfer at heat/fluid interface surface 18 is through convection. The center of the surface of heat/fluid interface surface 18 is directly below impingement jet channel 52 and contains point of impingement 42.

Figure 6:
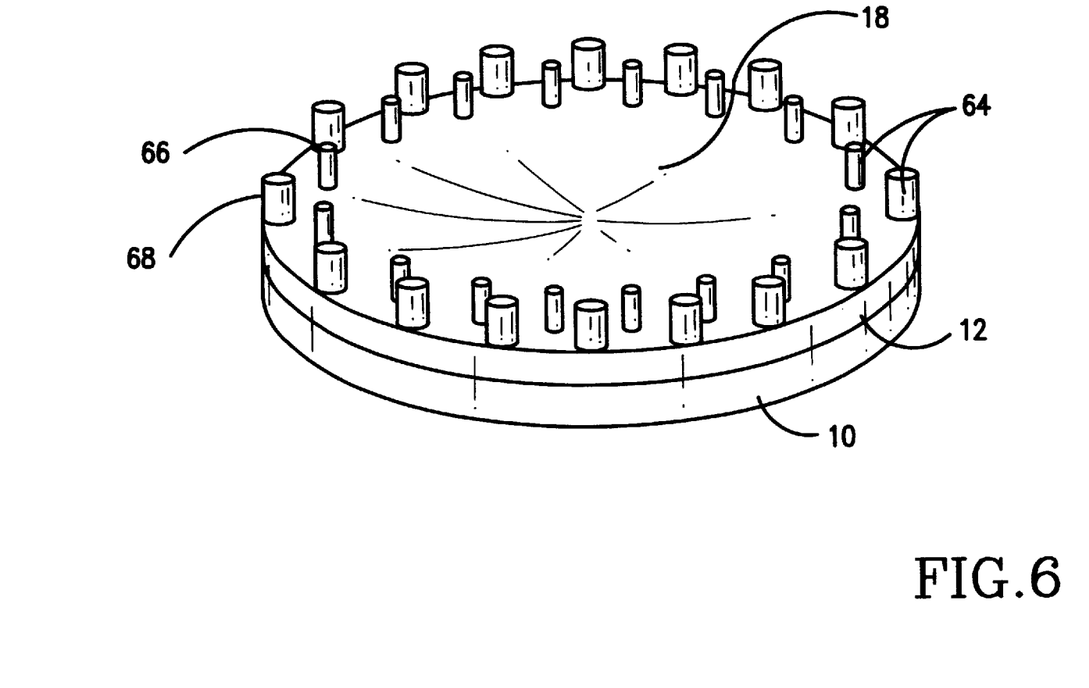
FIG. 6 shows the pin-fin heat sink and heat spreader plate of the present invention.

Referring now to FIG. 6, the central area of heat/fluid interface surface 18 of heat spreader plate 12 is concave and free from surface protrusions. The concavity of the surface allows the coolant to come into closer proximity with heat source 10 and also increases the area available for heat transfer without significantly increasing fluid energy requirements.

Referring again to FIG. 4, cold plate 14 absorbs heat from fluid coolant 30 at a heat dissipation/fluid interface surface 20. Heat spreader plate 12 and cold plate 14 are constructed of oxygen-free copper. The high thermal conductivity of cold plate 14 allows the heat to be evenly distributed to heat dissipating device 16. Heat dissipating device 16 can be attached or pressed against an extended surface or such apparatus that is to direct the thermal energy to the ultimate heat sink (not shown). Heat spreader plate 12 and cold plate 14 are roughly equivalent in diameter to heat source 10 and heat dissipating device 16. If heat spreader plate 12 or cold plate 14 are smaller than heat source 10 or heat dissipating device 16, heat spreader plate 12 and cold plate 14 are sized to a thickness that will allow full heat spreading, but not so thick as to add unnecessary thermal resistance. The actual thicknesses of heat spreader plate 12 and cold plate 14 are dependant on the thermal conductivity of the chosen material and the ratios of equivalent radius (a/b) where: a=equivalent radius of heat source 10, and b=the equivalent radius of heat spreader plate 12, and the equivalent radius of a square surface is found by $(L \times W/\pi)^{.5}$, where L=length of one side, and W=length of side perpendicular to side L. A heat source/heat spreader plate thermal interface 58, and a cold plate/heat dissipating device thermal interface 60 are optimized for thermal conduction by such methods as thermal pads, greases, joint compounds, gold-silicon eutectic bonding, or chromium-copper interface layers. Such methods are well known in the art and taught by Lee in U.S. Pat. No. 4,620,215 (1986).

Curved outer wall 22 is hermetically sealed to heat spreader plate 12 and to cold plate 14. An inner channel wall 24, like inner surface of outer wall 22 is smooth and free from surface defects and irregularities that may induce fluid turbulence. Inner channel wall 24 forms the outer surface of channel wall body 26. Channel wall body 26 is toric in shape, and is thermally non-conductive through-out. Fluid expansion surface 46 comprises the lower surface of channel wall body 26.

Channel wall body 26 is constructed of a smooth-skinned, foamed plastic, such as polyurethane. If the inside of channel wall body 26 contains one or more voids, these voids must be very small and result in a Rayleigh number of less than 1600, or decreased performance will result. Channel wall body 26 is held in place by attachment to the uppermost surfaces of heat spreader extended surface 28.

The invention is filled by fluid coolant 30 that is used to enhance the natural convection process and has a numerically high, free convection parameter. Other fluid coolant factors such as temperature range, toxicity, material incompatibility, electrical characteristics, etc., should also be considered.

Fluid contraction surface 48 of channel wall body 26 is shaped to allow fluid coolant 30 to contract and fall to point of impingement 42 with a minimum loss of momentum and fluid energy. Fluid contraction surface 48 has a non-linear curvature. The diameter of impingement jet 52 is sized to provide a maximum velocity with a minimum of fluid energy loss.

Figure 5:
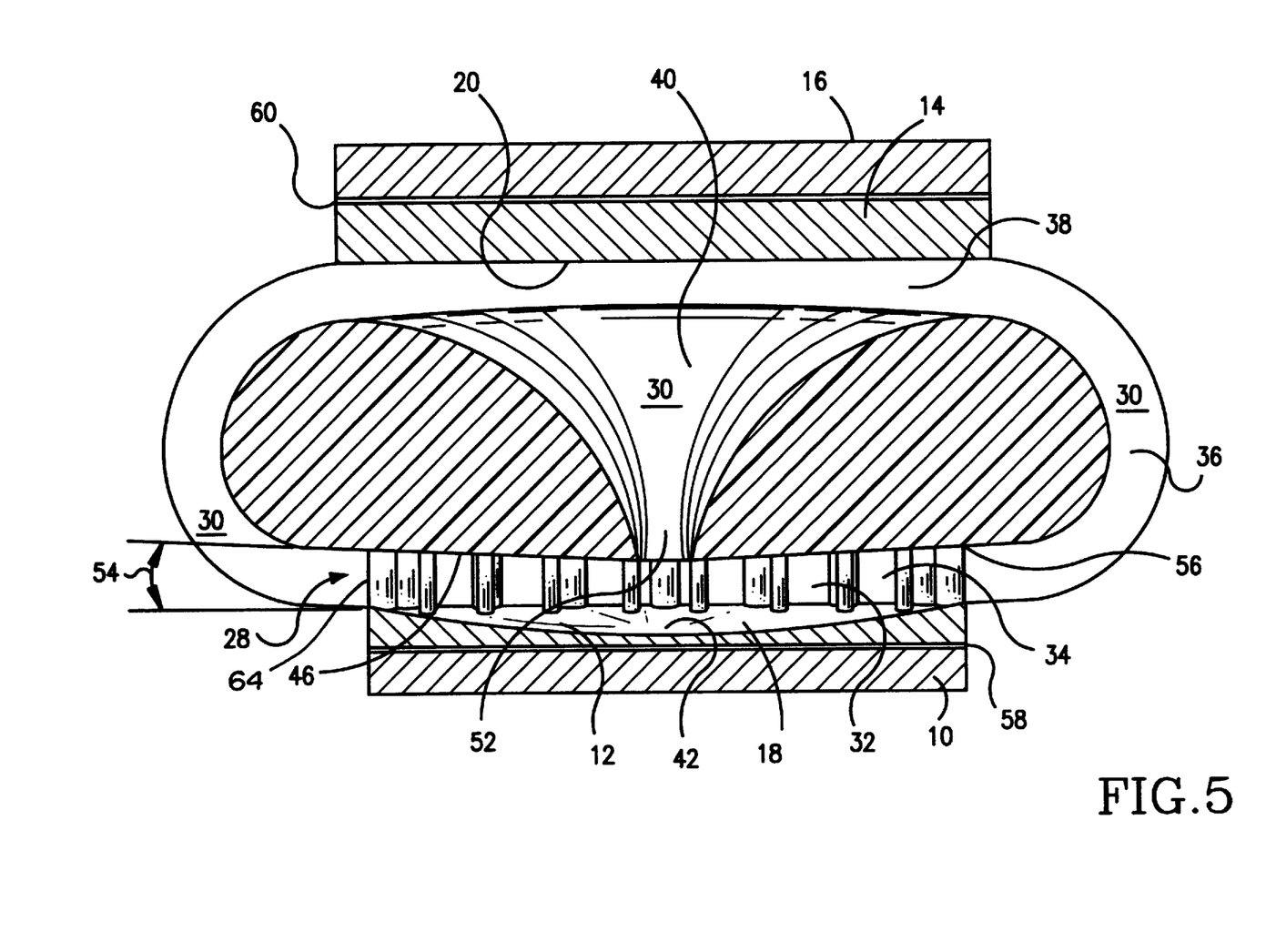
FIG. 5 presents a sectional view of the liquid coolant circulation path of the present invention.

Referring now to FIG. 5, fluid expansion surface 46 increases in distance from heat/fluid interface surface 18 as the radial distance increases from point of impingement 42. An optimum angle 54 of the increasing distance is related to the heat input, volumetric flow rate, and the fluid properties of thermal expansion, and specific heat. The slope of angle 54 is linear. A highest edge of angle 56, of fluid expansion surface 46 allows the volume between heat/fluid interface surface 18 and fluid expansion surface 46 to equal the thermally-induced increase in fluid volume at the volumetric flow rate established by heat source 10.

Referring again to FIG. 6, pin-fins 64 are of such an arrangement so as to minimize the fluid energy loss. A pin-fin inner circle 66 contains pin-fins 64 that are staggered to, and are of an equal number but smaller diameter than a pin-fin outer circle 68. The smaller diameter of pin-fins 64 in pin-fin inner circle 66 allows equal cross-sectional area and therefore velocity, for fluid flow through pin-fin outer circle 68.

Figure 7:
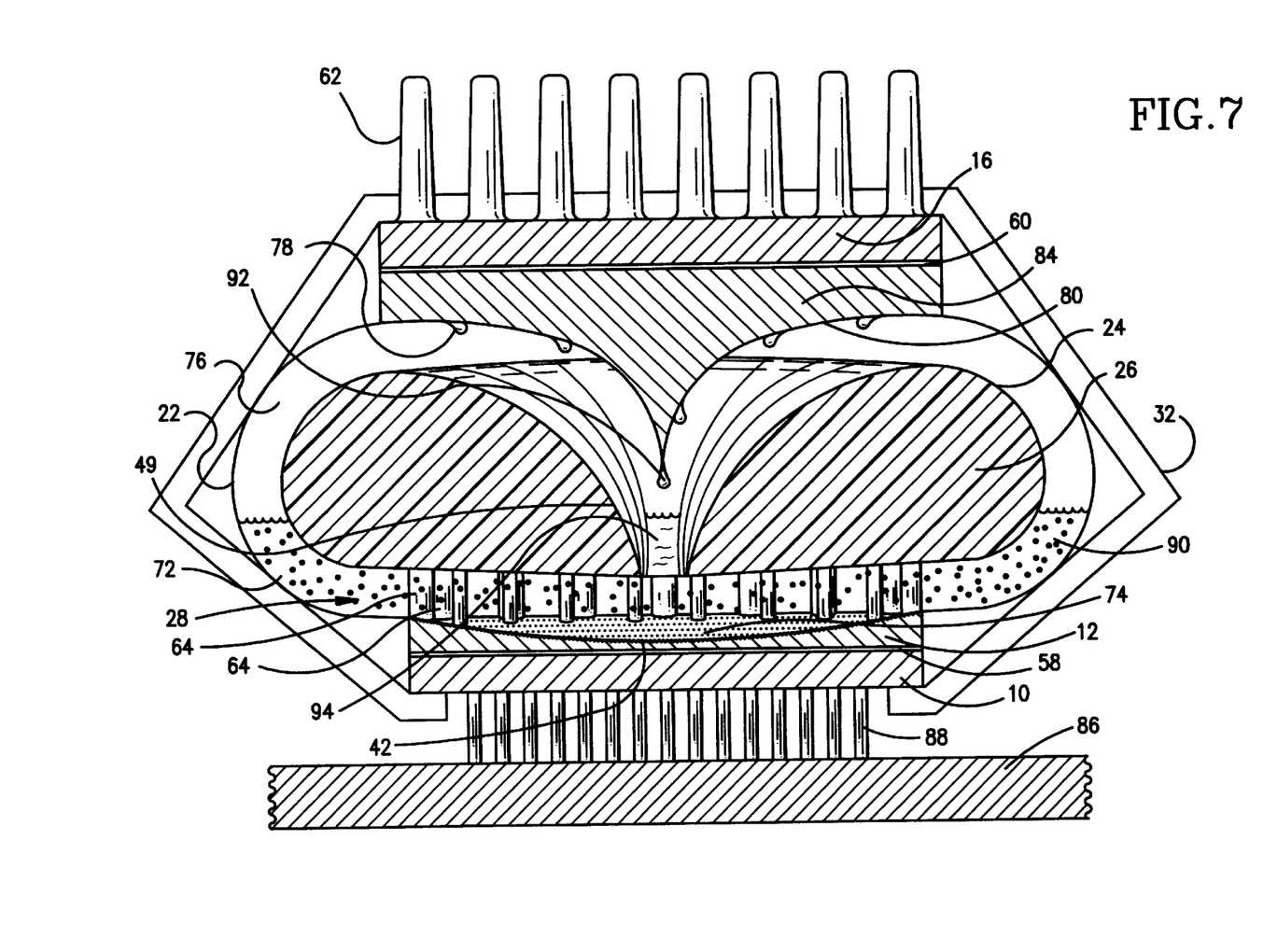
FIG. 7 portrays the device in a sectional view in the phase change coolant configuration, with spring clip, in a typical application.

Referring to the preferred two-phase embodiment shown in FIG. 7, Heat source 10 is in intimate thermal contact with heat spreader plate 12 and a condenser mass 84 is in intimate contact with heat dissipating device 16 through heat source/ heat spreader plate thermal interface 58 and cold plate/heat dissipating device thermal interface 60 respectively. Condenser mass 84 is constructed of a highly thermally conductive material such as copper or aluminum. The intimate contact described is provided by a spring clip 82 which has a characteristic highly elastic shape. Heat dissipating device 16 is shown with pin-finned extended surface 62. Heat source 10 is depicted as a computer microprocessor integrated circuit mounted to a printed circuit board 86 by a plurality of electrical signal, power, and grounding, etc. pins 88. Printed circuit board 86 is usually made of a fiber reinforced material or a rigidized flexible dielectric with copper circuit traces attached thereto. Pins 88 are usually of a gold or tin-plated material such as copper. The heat/fluid interface surface of previous embodiments had been replaced with a high thermal conductivity and geometrically similar, but rough-surfaced, dendritic heat/fluid interface surface 74. The rough surface of dendritic heat/fluid interface surface 74 allows numerous sites for the initiation of nucleate pool boiling of a two-phase fluid coolant 90 to occur. For electronic devices, two-phase fluid coolant 90 may be a perfluorocarbon compound with a maximum boiling point roughly 25° C. below the maximum junction temperature of the semiconductor. The dendritic surface 74 may be formed by selective etchants, laser cutting, or sintering, or as part of a powdered metal process for manufacturing heat spreader plate 12. The powdered metal process must ensure that the finished product is non-permeable to a vaporized coolant 76 phase of two-phase fluid coolant 90. A boiling liquid phase 72 of two-phase fluid coolant 90 fills this embodiment of the current invention to roughly the geometric halfway point. Vaporized coolant phase 76 of two-phase fluid coolant 90 fills the remaining internal void within outer surface 22. The condensate of two-phase fluid coolant 90 forms a coolant condensate droplet 78 on a condenser surface 80 of condenser mass 84. These coolant condensate droplets 78 are gravity-urged to become a falling coolant droplet 92 at the lowest point of condenser surface 80. The cooler (relative to boiling liquid phase 72) falling coolant droplet 92 falls into impingement-jet supply pool 94 formed on the perimeter by fluid contraction surface 48 and on the bottom by point of impingement 42. The geometric similarity of dendritic heat/fluid interface surface 74 and heat/fluid interface surface 18 of the previous embodiments includes the adoption of heat spreader extended surface 28, comprised in this embodiment of pin-fins 64 configured as shown in FIG. 6. Channel wall body 26 is supported by the uppermost surfaces of pin-fins 64. Channel wall body 26 should be constructed of a material that will compress inwardly without unduly disrupting the smooth surface contour of inner channel wall 24 while maintaining a thermally insulative material property.

Figure 8A:
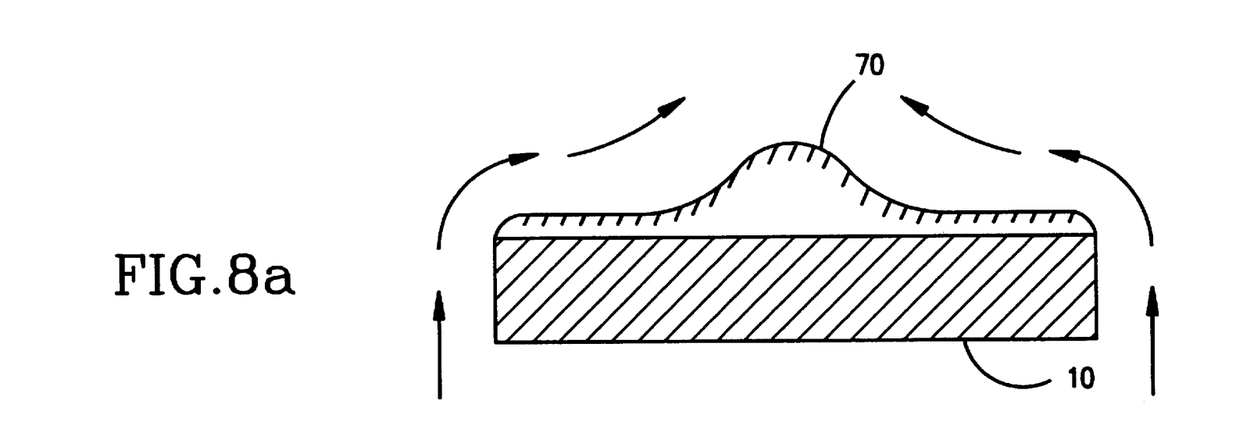
FIG. 8a portrays the air flow and thermal boundary layer in proximity to a horizontally oriented, heated device.

Referring now to FIG. 8a, heat source 10 is shown mounted in a horizontal position. A thermal boundary layer 70 characteristic of natural convection on horizontal surfaces is shown. The shape of thermal boundary layer 70 is formed by factors of the Reynolds number and other coolant properties.

Figure 8B:
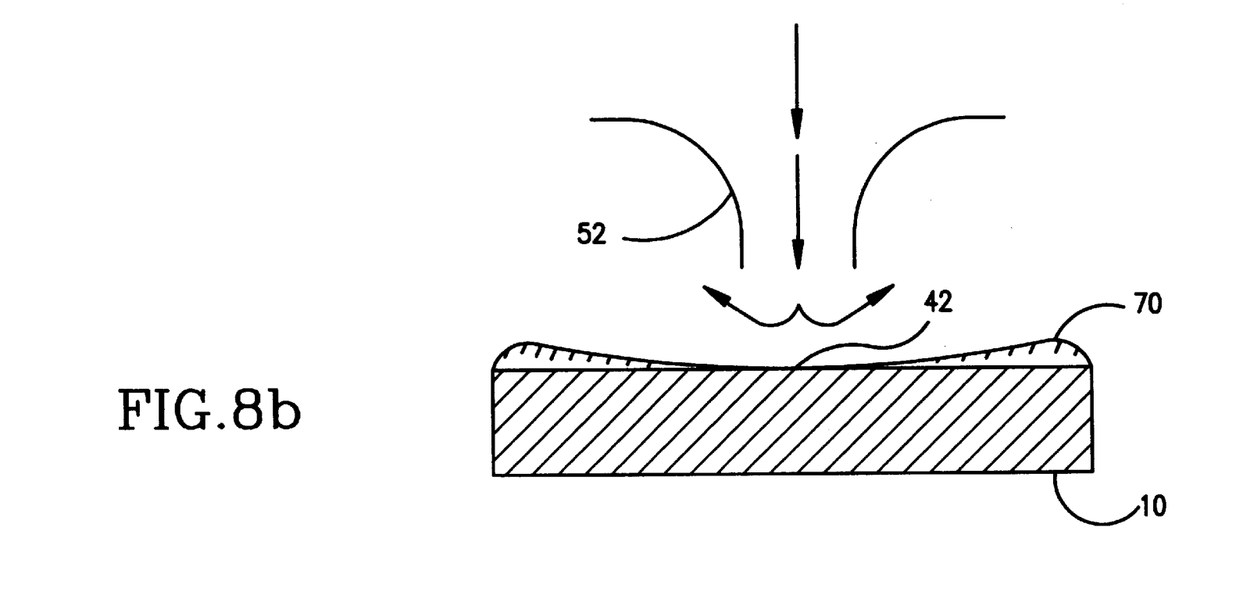
FIG. 8b demonstrates the jet-impingement flow and influence on thermal boundary layer reduction.

Referring now to FIG. 8b, impingement jet channel 52 of the present invention is shown in relation to point of impingement 42 and the greatly reduced thermal boundary layer 70.

Operation—FIG. 1 to 8

Referring now to FIG. 1 of the present invention, geometric form 13 in this embodiment is designed to be used in an ambient air environment. When attached to a typical computer chip, geometric form 13 and heat spreader extended surface 28 of the present invention will reduce the temperature rise of the computer chip from the previously indicated 45° C. to a temperature rise of roughly 25° C.

FIG. 2 depicts an external view of the present invention when the invention is filled with a liquid coolant media. Liquid coolants have a much higher numerical free convection parameter, and can therefore provide greater heat absorption and dissipation.

Referring to FIG. 5, thermal energy from heat source 10 travels through heat source/heat spreader plate thermal interface 58 to heat spreader plate 12. Thermal energy is then conducted through heat spreader plate 12 to heat/fluid interface surface 18 and heat spreader extended surface 28. Thermal energy is transferred by convection to fluid coolant 30. Heat spreader extended surface 28 enhances the Transfer of thermal energy because of the increased surface area. A heated fluid coolant 32 is heated and begins to expand 34. A heated, less dense coolant begins to rise 36. Rising fluid coolant 36 approaches cold plate 14 and velocity slows due to the greater cross-sectional flow area. Fluid heat energy is released by convection to heat dissipation/fluid interface surface 20. Heat energy is then conducted through cold plate 14 then across cold plate/heat dissipating device thermal interface 60 and then to heat dissipating device 16. A cooled fluid 38 contracts. As cooled fluid 38 contracts, a fluid coolant begins to fall 40. As heated fluid continues to rise 36 falling fluid 40 is both pushed from the high pressure side and pulled from the low pressure side through impingement jet orifice 52. Fluid impinges against concave heat/fluid interface surface 18 at point of impingement 42.

While natural convection heat transfer will dominate conduction when there is a sufficient distance and $\Delta T$ between two surfaces (when immersed in a gaseous or liquid coolant media), the operating range of the jet-impingement feature of this invention is limited by the optimization of the geometry for a specific coolant media. The envelope for efficient operation during the two-phase jet-impingement process is smaller still. In some combinations of power input, geometry and coolant media viscosity, the jet-impingement process may operate in reverse, lowering the heat transfer capability of the device dramatically. Such reverse operation has been seen during computer simulations but did not occur during actual testing.

Referring now to FIG. 8a, horizontally mounted heat source 10 releases heat through a thick thermal boundary layer 70. The natural convection of the ambient media causes thermal boundary layer 70 to become greater at the geometric surface center of heat source 10. The center of heat source 10 is generally where an electronic device heat source produces the greatest heat density.

Referring now to FIG. 8b, impingement jet 52 of the present invention greatly reduces thermal boundary layer 70 at point of impingement 42.

Theory of Operation

Reliability losses have been related to an electronic device's operating characteristic changes. Temperature changes in particular are known to induce failures within a device. The failures attributed to temperature can be quantified as a normalized failure rate defined by an Arrhenius equation, $\theta_n = \theta T/\theta T_r = \text{Exp}\ [(E_A/k)(T_r^{-1} - T^{-1})]$. Where $\theta$=Failure rate; $\theta_n$=Normalized failure rate; T=Absolute junction temperature (K); $T_r$=Reference temperature (K); $E_A$=Activation energy (eV); and k=Boltzmann's constant: $8.616 \times 10^{-5}$ (eV/K). The heat transfer path through the invention begins at the heat source/heat spreader plate thermal interface 58. The rate of heat transfer is controlled by conduction and is influenced by the pressure at the interface. The contact resistance is affected by many factors, but primarily by the roughness of the contact surfaces, and the interstitial fluid in the void space. One formula for determining the heat transfer coefficient (h) through heat source/heat spreader plate thermal interface 58, and cold plate/heat dissipating device thermal interface 60 is $h=[k_f Y/(\sigma_1+\sigma_2)]+8000k\ (CP_a/H)^{86}$. Where $k_f$=thermal conductivity of the interstitial fluid (W/m² K); Y=peak line of contact of surfaces (m); $\sigma_1$=RMS (root-mean-square) roughness of first surface (m); $\sigma_2$=RMS roughness of second surface (m); k=thermal conductivity of contact materials (W/m² K); C=constant (dimensionless); $P_a$=apparent pressure (kg/m²); H=hardness (kg/m²).

Optimum angle 54 of the increasing distance from point of impingement 42 is related to the heat input Q, volumetric flow rate m, fluid properties of thermal expansion $\beta$, and specific heat $c_p$. Angle 54 is linear because of the linear nature of $\beta$. Calculating $Q\beta/mc_p$ results in the volume increase per unit temperature rise over time. Highest edge 56, of fluid expansion surface 46 allows the volume between heat/fluid interface surface 18 and fluid expansion surface 46 to equal the increase in fluid volume at the volumetric flow rate established by heat source 10. If the inside of channel wall body 26 contains one or more voids, these voids must result in a Rayleigh number $(\rho^2 g L^3 \beta c_p \Delta T/\mu k)$ of less than 1600, where L is the void's greatest dimension and k is the thermal conductivity of the media filling the void, or decreased performance will result. Fluid coolant 30's suitability for use as a coolant in the present invention is found by a relative numerically high, free convection parameter, $\rho^2 g \beta c_p/\mu k$. Other fluid coolant factors such as temperature range, toxicity, material incompatibility, electrical characteristics, etc., must also be considered. Fluid contraction surface 48 has a non-linear curvature because of the effect of gravity g, on the linear $\beta$.

Impingement jet 52 is sized to provide a maximum velocity with a minimum of fluid energy loss. Available pressure generated by the thermosyphon effect is found by $\rho \beta \Delta T g L$. Due to the varying cross-sectional flow area through out the device, fluid coolant velocity varies widely. A fluid coolant reference velocity is found by $\sqrt{\beta \Delta T g H}$, where H is the hydraulic height of the apparatus.

Impingement et 52 of the present invention greatly reduces thermal boundary layer 70 at point of impingement 42. The Nusselt number for a submersed impinging jet process such as the present invention is found by the empirical formula $1.29\ \text{Re}^5\ \text{Pr}^4$. I believe the convection coefficient, $h_c$, is based on half the length of heat source 10, because of the radial direction of coolant flow. The Reynolds number in a natural convection device is found by the square root of the Grashof number $(L^3 \rho^2 g \Delta T/\mu^2)$. In this embodiment d replaces L in the Grashof number and is the diameter of impingement jet 52. Actual $\Delta T$ is found by $Q/(h_c A_s)$.

Heat dissipation is very efficient in the present invention. In the 1 Watt electronic device described earlier, natural convection in ambient air yielded a temperature rise of 45°

C. In the present invention with water as fluid coolant 30, ΔT is calculated as about 2° C. above the impingement jet, fluid coolant temperature.

For more efficient operation, a coolant media that changes phase within the working temperature of this device is advantageous. Generally, by way of example, perfluorocarbon fluids will operate within the temperature range of electronic devices. Because of the greater internal pressure during phase change, channel wall body 26 will accept the increased pressure by equally compressing. The compression of the small voids within the channel wall body will allow the device to operated without exceeding the internal pressure design limits.

When the device is operated in the phase change mode, heat transfer through boiling and condensation are important. At the initiation of boiling, the steady state jet impingement operation is disrupted by the randomized motion of the turbulent coolant media. During this phase, the device operates in a pool boiling configuration. Heat transfer is found by the following equation:

$$q'' = 481 \times 10^{-6} \Delta T_x^{3.33} P_{cr}^{2.3} \left[ 1.8 \left( \frac{p}{p_{cr}} \right)^{.17} + 4 \left( \frac{p}{p_{cr}} \right)^{1.2} + 10 \left( \frac{p}{p_{cr}} \right)^{10} \right]^{3.33}$$

where: q"=heat transfer (W/m²), $\Delta T_x$=excess temperature (°C.), p=operating pressure (bar), $P_{cr}$=critical pressure (bar). During operation, the heat transfer from the surface must be kept below the critical heat flux (CHF). The CHF can be found by:

$$q_{CHF} = \frac{\pi}{24} \rho_v^5 h_{fg} [\sigma g (\rho_l - \rho_v)]^{.25}$$

where $q_{CHF}$=critical heat flux (W/m²), $\rho_u$=saturated vapor density (kg/m³), $\rho_1$=saturated liquid density (kg/m³), $h_{fg}$=latent heat of vaporization (J/kg), σ=surface tension of the liquid-to-vapor interface (N/m), g=gravitational acceleration (m/s²).

When the saturated vapor comes into contact with the condenser surface, condensation is produced. During normal operation, continuous droplets of fluid form and fall into the impingement jet channel. Heat transfer from the condensing vapor is primarily due to conduction through the droplets. Because the droplets flow, due to gravity, the formula for predicting the heat transfer is greater than that seen in the standard heat conduction formula, and follows:

$$h_c = .943 \left[ \frac{\rho_l(\rho_l - \rho_v) g \, h_{fg} \, k^3 \sin\psi}{\mu_l L (T_{sv} - T_s)} \right]^{.25}$$

where: $h_c$=average heat transfer coefficient (W/m² °C.), $\rho_1$=saturated liquid density (kg/m³), $\rho_u$=saturated vapor density (kg/m³), g=gravitational acceleration (m/s²), $h_{fg}$=latent heat of vaporization (J/kg), k=thermal conductivity of condensate (W/m²), ψ=average angle of surface from horizontal (°), μ=absolute viscosity (N s/m², L=vertical surface height, $T_s$=surface temperature (°C.), $T_{sv}$=vapor saturation temperature (°C.).

Summary, Ramifications, and Scope

Accordingly, the reader will see that the thermosyphon jet-impingement feature of this invention can be used to cool any device in which the advantaged of enhanced natural convection cooling is important.

Although the description above contains many specifications, these should not be construed as limiting the scope of the invention but as merely providing illustrations of some of the presently preferred embodiments of this invention. For example, the external envelope may have other geometric shapes, such as cubic, pyramidal, conic, prismic, cylindrical, etc.; the fluid may be allowed to vaporize upon heating and condense upon cooling (two-phase); the fluid may be a dielectric and allowed to come into direct contact with an unpackaged electronic circuit, etc.; the internal and external extended surfaces may have other shapes such as lanced, offset, straight, wavy, etc.; heat transfer to the ultimate heat sink may take place at a remote location, whereby the coolant is thermosyphoned to the remote location for cooling and back again, etc.

Thus the scope of the invention should be determined by the appended claims and their legal equivalents, rather than by the examples given.

I claim:

1. A natural convection heat transferring apparatus for transferring heat energy from a higher temperature heat source to a lower temperature heat sink, said apparatus comprising:
    a heat spreader plate;
    a heat sink;
    a toric body connected to and positioned above and in thermal contact with said heat spreader plate to allow a coolant fluid to be heated by said heat spreader plate and flow upwardly along an outer surface of said toric body and then to be cooled by said heat sink and flow downwardly through a center of said toric body directing the coolant fluid to impinge on said heat spreader plate and continue to circulate around and through said toric body due to a gravity dependent thermosyphon effect created by said toric body; and
    an outer wall surrounding said toric body and containing the coolant fluid, said outer wall connected to the heat spreader plate and the heat sink.

2. The apparatus according to claim 1, wherein said heat spreader plate is connected to said toric body by a thermally conductive connection.

3. The apparatus according to claim 2, wherein said heat spreader plate is provided with an upper surface beveled upwardly from a center to an outer edge thereof.

4. The apparatus according to claim 1, wherein a lower surface of said toric body tapers upwardly from a center to an outer edge thereof.

5. The apparatus according to claim 2, wherein said thermally conductive connection is defined by at least one thermally conductive pin fin.

6. The apparatus according to claim 1, wherein said toric body is made of a thermally insulating material.

7. The apparatus according to claim 1, wherein said outer wall is spherically shaped.

8. The apparatus according to Claim 1, further including an upper thermally conductive plate provided on an upper portion of said outer wall.

9. The apparatus according to claim 8, including a heat dissipating device including cooling fins, said heat dissipating device being provided on an upper portion of said upper thermally conductive plate.

10. The apparatus according to claim 8, including a thermally conductive condenser provided in an upper portion of said outer wall to condense a two phase coolant fluid.

11. A cooling device for removing waste heat energy from an apparatus, said apparatus comprising:
    a thermally conductive plate to be thermally connected to the apparatus to be cooled;

a toric body connected to and positioned above said thermally conductive plate circulating a coolant fluid upwardly along an outer surface of said toric body and then downwardly through said toric body resulting from coolant fluid being heated by the apparatus at a lower portion of said toric body and then the heated coolant fluid being cooled by a heat sink at an upper portion of said toric body;

an outer wall surrounding said toric body for containing said coolant fluid, said outer wall connected to said thermally conductive plate; and an upper thermally conductive plate connected to said outer wall for providing a heat sink.

* * * * *